United States Patent [19]

DiBiase et al.

[11] Patent Number: 4,758,800

[45] Date of Patent: Jul. 19, 1988

[54] LOW NOISE MAGNETICALLY TUNED RESONANT CIRCUIT

[75] Inventors: Robert DiBiase, Carlisle; Zvi Galani, Bedford; Raymond C. Waterman, Jr., Westford; Ernst F. R. A. Schloemann, Weston; Ronald E. Blight, Framingham, all of Mass.

[73] Assignee: Raytheon Company, Lexington, Mass.

[21] Appl. No.: 33,306

[22] Filed: Apr. 2, 1987

[51] Int. Cl.[4] .......... H03L 7/06

[52] U.S. Cl. .......... 331/1 R; 331/77; 333/219

[58] Field of Search .......... 331/1 R, 18, 77; 333/202, 219, 235

[56] References Cited

U.S. PATENT DOCUMENTS

| | | | |
|---|---|---|---|
| 3,895,312 | 7/1975 | Tipon | 331/18 |
| 4,415,854 | 11/1983 | Remy | 324/79 R |
| 4,543,543 | 9/1985 | Blight et al. | 333/24.1 |
| 4,555,678 | 11/1985 | Galani et al. | 331/1 A |
| 4,651,116 | 3/1987 | Schloemann | 333/202 X |

OTHER PUBLICATIONS

Taylor Lyman et al., "Magnetically Soft Materials", Metals Handbook, 8th Edition, vol. 1, Properties and Selection of Metals, (1961), p. 790.

*Primary Examiner*—Eugene R. LaRoche
*Assistant Examiner*—David Mis
*Attorney, Agent, or Firm*—Denis G. Maloney; Richard M. Sharkansky

[57] ABSTRACT

A magnetically tuned resonant circuit having improved noise performance includes a ferrimagnetic or gyromagnetic body such as a YIG sphere which is disposed within r.f. structure, The r.f. structure is disposed between a pair of pole pieces of a biasing magnet and flux return path. Several techniques are described for reducing fluctuations in magnetic fields through the gyromagnetic body. The gyromagnetic body is isolated from conductive surfaces, or the bulk of conductive surfaces in the region adjacent to the magnetic body are reduced. Further, a technique is also described which provides a break in the electrical continuity around the r.f. structure. Each of these technique reduce the magnitude of thermally induced eddy current flow in conductive regions adjacent to the resonant body. It is believed that such eddy current flow produce random magnetic field variations which produce random variations in the frequency characteristics of conventional magnetically tuned resonant circuits.

54 Claims, 8 Drawing Sheets

LOW NOISE MAGNETICALLY TUNED RESONANT CIRCUIT

BACKGROUND OF THE INVENTION

This invention relates generally to magnetically tuned resonant circuits, and more particularly to low noise magnetically tuned resonant circuits.

As it is known in the art, magnetically tuned resonant circuits, such as YIG filters, are used in many radio frequency applications, such as radar receivers. One application for a magnetically tuned resonant circuit is in a radio frequency oscillator. In particular, one type of oscillator includes a YIG band pass filter disposed in the feedback circuit of an amplifier. When the open loop gain and phase conditions of the oscillator are satisfied simultaneously at a certain frequency that is, when the open loop gain is greater than unity and the open loop phase shift is equal to an integer multiple of $2\pi$ radians, the circuit will operate as an oscillator at that particular frequency. A second application for a magnetically tuned resonant circuit is as a dispersive element in an interferometer type of frequency discriminator. For example, a microwave voltage controlled oscillator (VCO) which typically produce signals with high levels of frequency modulation (FM) noise, is stabilized with a frequency lock loop using the YIG filter as the dispersive element in the frequency discriminator.

In many of these applications the noise performance of the oscillator is a very important consideration. For example, in a doppler radar, noise generated at baseband frequencies that is noise generated at the frequencies of the order of expected doppler frequency shifts will reduce the subclutter visibility of the radar. In each of the applications mentioned above, the YIG filter or the magnetically tuned resonant circuit contributes to the noise induced in the circuit. This contribution is particularly important when the other components in the particular circuit are low noise components. Therefore, it is desirable to provide microwave tunable oscillators having very low noise characteristics.

SUMMARY OF THE INVENTION

In accordance with the present invention, a magnetically tuned resonant circuit includes: means for producing magnetic flux and means for providing a closed magnetic flux path. A magnetically inert member, having an aperture is disposed within the flux path and a gyromagnetic member is disposed in said aperature and is further disposed to have said magnetic flux directed therethrough. The magnetically tuned resonant circuit further includes means for reducing variations in the magnetic flux directed through said gyromagnetic member. With this arrangement, the means for reducing variations in the magnetic flux proximate to the gyromagnetic body, will provide a concomitant reduction in variations of the resonant frequency characteristics of the magnetically tuned resonant circuit.

In accordance with a further aspect of the present invention, the means for reducing variations in the magnetic flux directed through the gyromagnetic member includes means for reducing the electrical conductivity of the magnetically inert body which provides support for the gyromagnetic body. The electrical conductivity of the magnetically inert body is reduced by fabricating the magnetically inert body from a high resistivity material preferably a dielectric material. Optionally, the r.f. structure may be provided with a coating of an electrically conductive material. Preferably, the coating has a thickness in the range of about one to ten skin depths, preferably less than four skin depths at the microwave frequency of operation. Preferably still, the electrical conductivity of the r.f. structure is reduced by breaking the electrical continuity of the structure. With this particular arrangement by substantially reducing the conductivity of the r.f. structure, induced eddy current flow in the r.f. structure around the resonant body, and the magnetic field variations concomitant therewith are also reduced. Reduction is magnetic field variations through the YIG sphere will reduce the variations in resonant frequency of the magnetically tuned resonant circuit.

In accordance with a still further aspect of the present invention, the flux return path includes a pair of spaced surfaces within which is disposed the magnetically inert body having the gyromagnetic body. The means for reducing variations in the magnetic flux directed through the gyromagnetic resonant body includes a pair of pole caps which provide the pair of opposing spaced surfaces, said caps being comprised of a ferrite material with said caps being disposed adjacent the resonant body. Preferably, the caps are coated with an electrically conductive material having a thickness of about one to ten skin depths preferably less than four skin depths at the microwave frequency of operation. With such an arrangement, by providing a pair of ferrite pole caps to form the pair of opposing, spaced surface portions of the closed flux return path, the ferrite pole caps will provide a high resistance to flow of eddy currents and thus, reduced variations in magnetic flux. Thus, the reduced magnetic flux variations in the region through which the YIG sphere is disposed will provide lower variations in the resonant frequency of the magnetically tuned resonant circuit.

In accordance with a still further aspect of the present invention, the diameter of an aperture provided in the magnetically inert body is at least five times the diameter of the sphere disposed through the aperature. With this arrangement, by increasing the diameter of the aperture, the sphere will be removed from the proximity of metal sidewalls of the aperture in the magnetically inert body. Hence, currents induced in these conductive sidewalls will provide substantially reduced variations in the magnetic flux directed through the gyromagnetic body.

In accordance with an additional aspect of the present invention, an oscillator includes means for providing an electrical signal having a predetermined amplitude and means for feeding a portion of said electrical signal back to the input of said amplitude means. The feedback means includes means including a magnetically tuned resonant circuit, for providing a predetermined phase characteristic to said signal. The magnetically tuned resonant circuit includes means for reducing variations in resonant frequency thereof. With this arrangement, by providing a magnetically tuned resonant circuit having means for reducing variations in resonant frequency, the phase noise imparted to the signal fed therethrough will be reduced, and accordingly the oscillator will have lower frequency modulation noise levels.

In accordance with a still further aspect of the present invention, a low noise magnetically tuned oscillator comprises means for providing voltage controlled oscillations and a feedback circuit means, disposed around said voltage controlled oscillation means including means for detecting frequency noise from the voltage controlled oscillator means and feeding a signal back to said voltage controlled oscillator means and feeding response to said detected noise to cancel the frequency modulation noise in the oscillator. The feedback circuit means further includes a frequency discriminator and a video amplifier. The frequency discriminator includes a magnetically tuned resonant circuit which is used as a dispersive element and a frequency determining element of the oscillator. The magnetically tuned resonant circuit includes means for reducing variations in the magnetic flux directed through a gyromagnetic resonant body to reduce variations in the resonant frequency of the magnetically tuned resonant circuit. With this particular arrangement, since the magnetically tuned resonant circuit is a frequency determining element of the circuit and is used to provide a signal which cancels noise in the voltage controlled oscillator, reduction in noise contributed by the magnetically tuned resonant circuit will provide a concomitant reduction in the frequency noise of the microwave oscillator.

BRIEF DESCRIPTION OF THE DRAWINGS

The foregoing features of this invention, as well as the invention itself may be more fully understood from the following detailed description read together with the accompanying drawings, in which.

DESCRIPTION OF THE PREFERRED EMBODIMENTS

Figure 1:
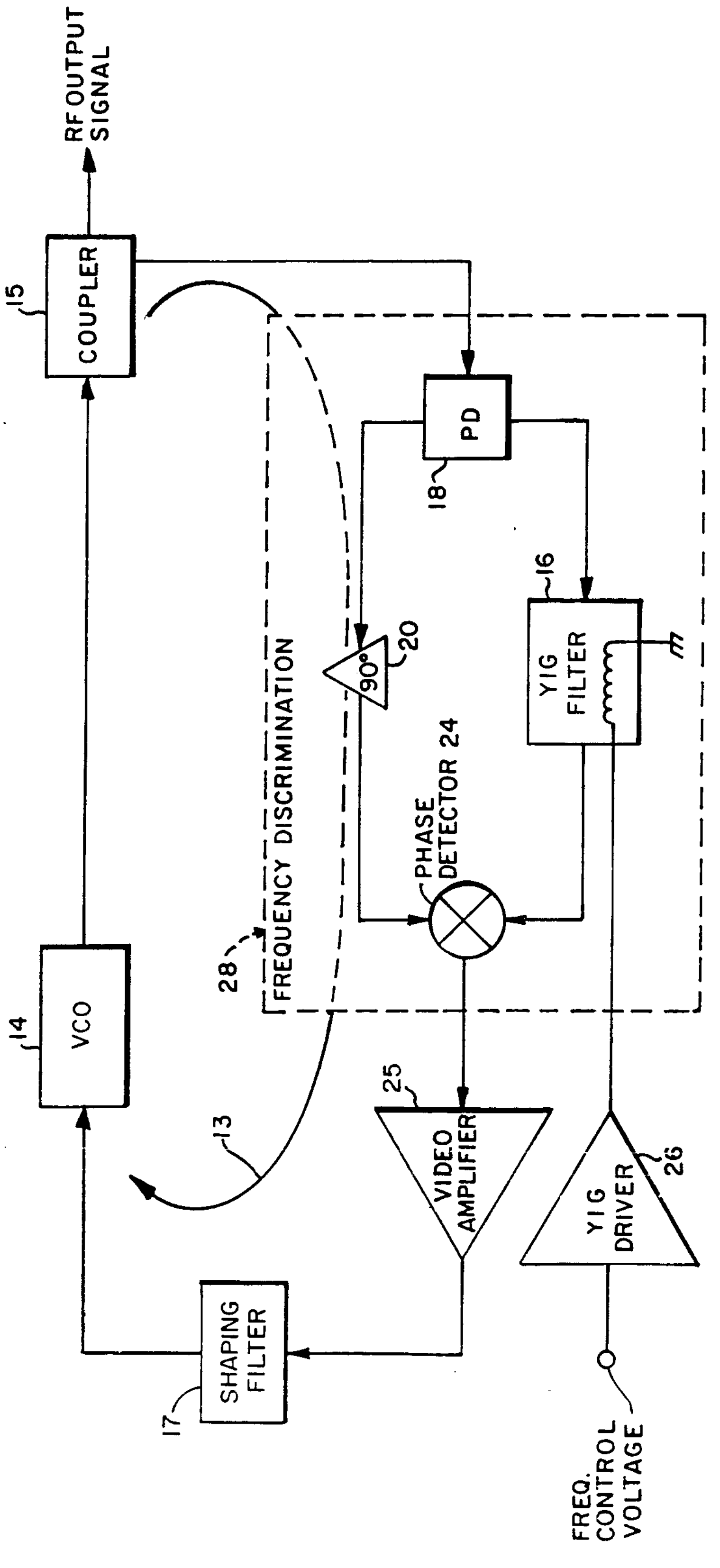
FIG. 1 is a block diagram of a low noise voltage controlled oscillator employing a magnetically tuned resonant circuit in a frequency modulation noise degeneration loop.

Referring now to FIG. 1, an oscillator 10 circuit is shown to include a magnetically tuned resonant circuit, here a YIG filter 16, used as a dispersive element in an inferometer type of frequency discriminator 28. The discriminator 28 is disposed in the feedback circuit 13 of a voltage controlled oscillator 14. The feedback circuit 13 includes the frequency discriminator 28 and a video amplifier 25. The frequency discriminator 28 includes the YIG filter 16, tuned to the frequency of the oscillator via a control signal fed through the YIG coil driver 26, means for providing a 90° phase shift at the frequency of the oscillator 10 and a phase detector 24 (balanced mixer). The phase detector 24 detects FM noise from the microwave voltage controlled oscillator 14 and converts the detected noise to a baseband voltage. This voltage is amplified by the video amplifier 25, filtered by a shaping filter 17, and sent properly phased to the voltage controlled oscillator to cancel frequency modulation (FM) noise in the oscillator output signal, as is generally known.

The lowest noise performance from an oscillator, as shown above, is provided when each of the components are low noise components. However, we have found that one of the most significant contributions to FM noise in such circuits in the magnetically tuned resonant circuit such as the YIG filter 16. Since the frequency of the oscillator signal is directly proportional to the resonant frequency of the YIG filter 16, noise in the YIG filter either from the YIG driver or pass band dither in the resonant frequency of the YIG filter will contribute to FM noise in the oscillator. When there is no danger of onset of spin wave instability, that is, by providing a sphere having a sufficient diameter and by providing sufficient input power to the sphere, the dither in the pass band will then become a significant source of frequency noise. Additive noise is reduced generally by filtering and selection of low noise components. However, noise contributed by dither in the pass band is now reduced as will now be described in conjunction with FIGS. 2–9.

Figure 2:
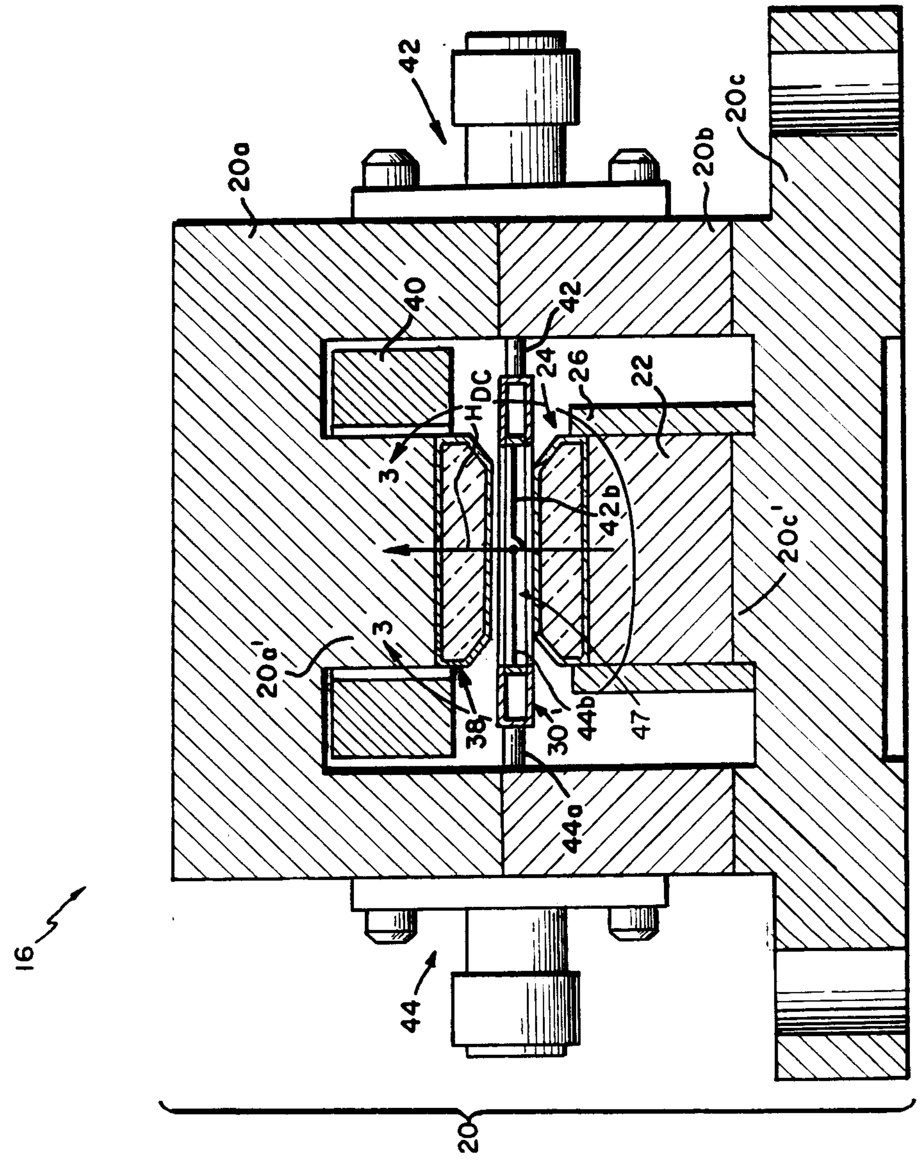
FIG. 2 is a cross-sectional view of a YIG tuned band pass filter fabricated in accordance with the present invention, which may be used as the magnetically tuned resonant circuit of FIG. 1.
Figure 3:
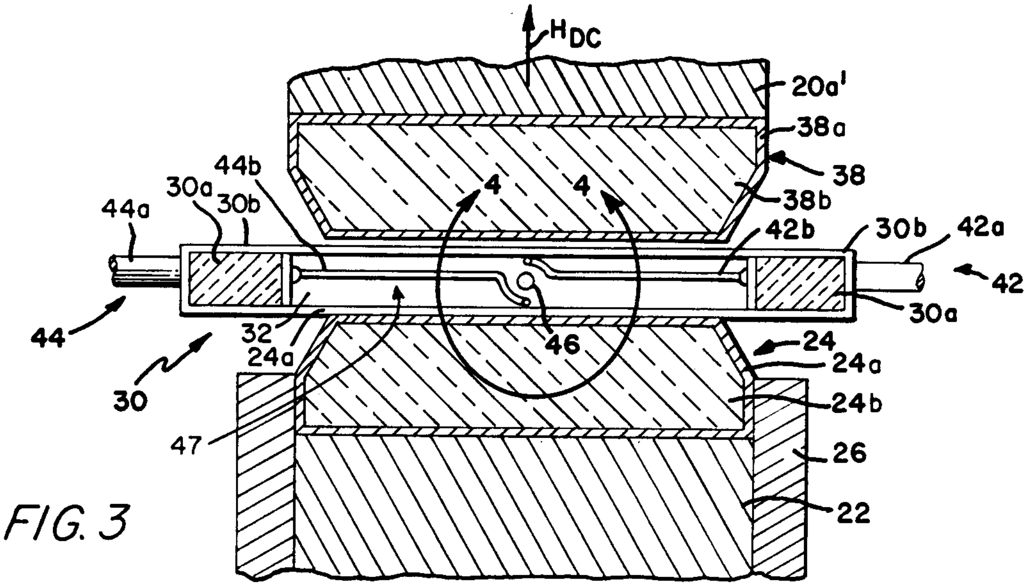
FIG. 3 is an enlarged view of the YIG filter shown in FIG. 2 taken along line 3—3 of FIG. 2.
Figure 4:
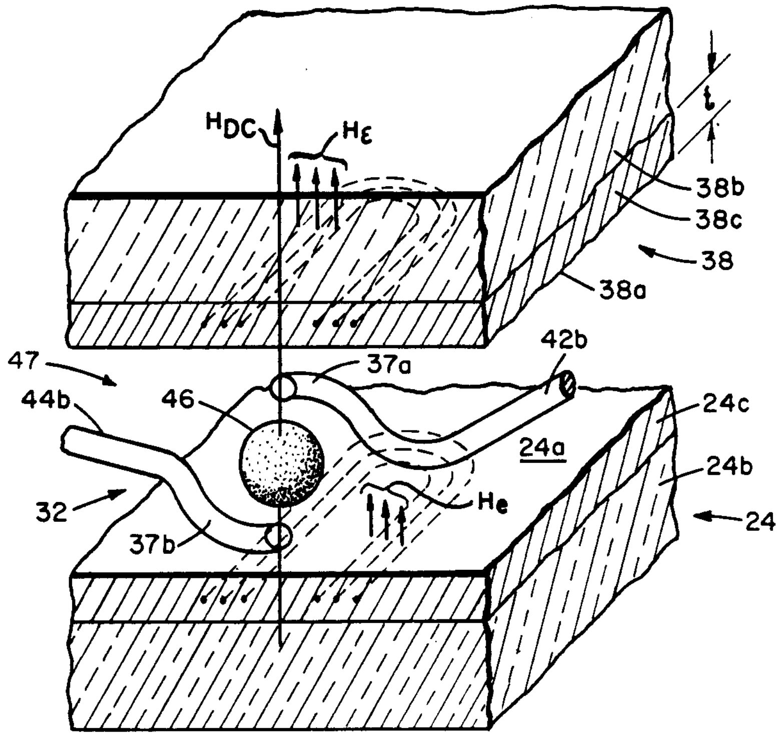
FIG. 4 is a diagrammatical view of a portion of the circuit shown in FIG. 3 taken along line 4—4 of FIG. 3.

Referring now to FIGS. 2–4, a low noise magnetically tuned resonant circuit here a low noise YIG band pass filter 16 is shown to include a composite filter housing 20, having an upper shell portion 20*a*, an intermediate shell portion 20*b*, and a lower shell portion 20*c*. Composite filter housing 20 is comprised of a magnetically permeable material and provides a closed magnetic path or flux return path, to direct magnetic flux through a gyromagnetic member 46 in a manner to be described. Upper shell section 20*a* includes a first, inner, centrally disposed fixed portion 20*a'* having disposed thereon a first pole piece 38, said pole piece 38 having an exposed surface portion 38*a*. Disposed around portion 20*a'* is an electromagnet provided to vary the strength of the D.C. magnetic field $H_{DC}$, as is known. Lower shell section 120*c* includes a second, inner, centrally disposed portion 20*c'* upon which is disposed a permanent magnet 22 to provide a source of magnetic flux and a second pole piece 24 having an exposed surface portion 24*a*, as shown. A temperature compensating sleeve 22 is optionally disposed around pole piece 24 and magnet 20, as shown. Intermediate shell portion 20*b* is shown having disposed over an upper surface portion thereof, a magnetically inert body member herein referred to as an r.f. structure 30. The r.f. structure 30 is disposed between surface portion 24*a* of pole piece 24 and surface portion 38*a* of pole piece 38. The r.f. structure 30 is comprised of a magnetically inert material, as will be described, and includes an aperture portion 45 and a pair of coaxial transmission lines 42, 44. Each one of the coaxial transmission lines 42, 44 include an outer conductor 42*a*, 44*a*, dielectrically spaced from a inner conductor 42*b*, 44*b*, respectively, as shown. The r.f. structure 30 further includes a body 46 here a sphere comprised of a gyromagnetic material such as yttrium iron garnet (YIG). YIG sphere 46 is disposed on an end portion of a mounting rod (not shown) which is disposed through a passageway (also not shown) provided through the r.f. structure 30. The r.f. structure 30 further includes a pair of coupling loop portions 37*a* and 37*b* of central conductors 42*b* and 44*b*. The loop portions 37*a*, 37*b* are disposed in the aperture 47 and around portions of the YIG sphere 46, with said portions of the YIG sphere 46 being disposed within the coupling loops 37*a* and 37*b*. Each of said coupling loops are arranged mutually orthogonal to one another and are spaced from the YIG sphere to provide a requisite amount of coupling to and from the sphere as is generally known in the art. Each one of said coupling loop portions 37*a*, 37*b* has end portions coupled to the r.f. structure to provide a short circuit to ground in the region of the YIG sphere 46 to thereby strongly couple to the YIG sphere 46, the r.f. magnetic field component of electromagnetic energy. One of said coupling loops here coupling loop 37*a* is disposed about the X axis and the second one of said coupling loops 37*b* is disposed about the Y axis. Therefore, the first coaxial transmission line in the presence of an applied external magnetic field $H_{DC}$ is used to couple a selected portion of said input radio frequency signal to the second one of said coaxial transmission line. The frequency of this coupled radio frequency energy is given in accordance with the equation $f_0=\gamma H_{DC}$ where $f_0$ is the resonant frequency of the filter 16, $\gamma$ is quantity referred to as the gyromagnetic ratio and is approximately equal to 2.8 MHz/Oersted for YIG, and $H_{DC}$ is the magnetic field strength provided through the YIG sphere by the permanent magnet 22. For high performance filters, the pole caps, and r.f. structure are placed under a predetermined compression to reduce vibration induced changes in resonant frequency.

Referring now to FIG. 3, the pair of pole caps, 24, 38 are shown disposed in the magnetic flux return path. The pole caps 24, 38 comprise a ferrite material 24*b*, 38*b* respectively, here having disposed thereover a coating of an electrically conductive material 24*a*, 38*a*. The electrically conductive material 24*a*, 38*a* preferably comprises a material such as gold or copper, for example and generally has a thickness equal to at least about one skin depth, but generally less ten skin depths, preferably less than four skin depths at the resonant frequency of the YIG bandpass filter. Accordingly, at the noise frequencies of interest particularly at those of the order of expected doppler frequency shifts, when such a YIG filter is used in a doppler radar receiver, for example, induced magnetic fields resulting from current flow in conductive surfaces of the pole caps will be eliminated because the ferrite is an electrical insulator and, hence, no current will flow. Alternatively, if a conductive coating is provided over the ferrite, such a coating having a thickness of the order of skin depths at the resonant frequency, will provide a high resistivity path to any induced current flow from noise sources at frequencies of the order of 200 KHz or less.

Referring back to FIGS. 3 and 4, it should also be noted that an alternative to providing the pole cap arrangement shown, the r.f. structure 30 may be fabricated from a high resistivity material having a resistivity of at least about 100 micro ohm-cm or from a dielectric such as a hard dielectric 30*a* such as a ceramic. Here the dielectric portion 30*a* has disposed thereover a conductive coating 30*b* of gold and copper, for example, having a thickness of the order of 1–10 skin depths preferably less than four skin depths at the resonant frequency of the YIG filter 16. The high resistivity materials may be metal alloys, such as copper, manganese, nickel alloys such as 67Cu-SNi-27Mn, ($\rho=99.75$ $\mu$ohm-cm) nickel base alloys such as 80Ni-20Cr ($\rho=112.2$ $\mu$ohm-cm), 75Ni-20Cr-3Au with (Cu or Fe) ($\rho=133$ $\mu$ohm-cm) or iron chromium aluminum alloy such 72Fe-23Cr-5Al-0.5Co ($\rho=135.5$ $\mu$ohm-cm). The hard, refractory dielectrics are ceramics such as alumina ($Al_2O$) beryllium oxide (BeO) and silica ($SiO_2$) or other suitable insulating materials. Each of these arrangements reduces the bulk of or the conductivity of the material which provides the r.f. structure 30. Since, theoretically derived expressions indicate that $H^2$ (magnetic field noise) is inversely proportional to $\rho$, an increase in $\rho$ will provide a corresponding decrease in the magnetic field noise. That is, the currents induced in the r.f. structure 31 will be weaker due to higher $\rho$ and hence will induce weaker magnetic field fluctuations. Typically, materials chosen for high performance YIG filter r.f. structures are Cu or Cu alloys having resistivities between 1.7 $\mu$ohm-cm for Cu to 49.88 for 55Cu-45Ni.

As also shown in FIGS. 3 and 4, the aperture 32 through which the YIG sphere 46 is disposed has a diameter equal to at least five sphere diameters. With this particular arrangement, since the sphere 46 is relatively isolated from the conductive sidewalls of the aperture 41 in the r.f. structure 30, the sphere 46 will also be isolated from magnetic field variations resulting from currents circulating in these conductive sidewalls.

Referring now to FIGS. 5A–5E, system noise as a function of offset frequency for five different pole cap arrangements is shown. Each of these measurements were taken with a test fixture that generally simulated the oscillator described in conjunction with FIG. 1.

Figure 5A:
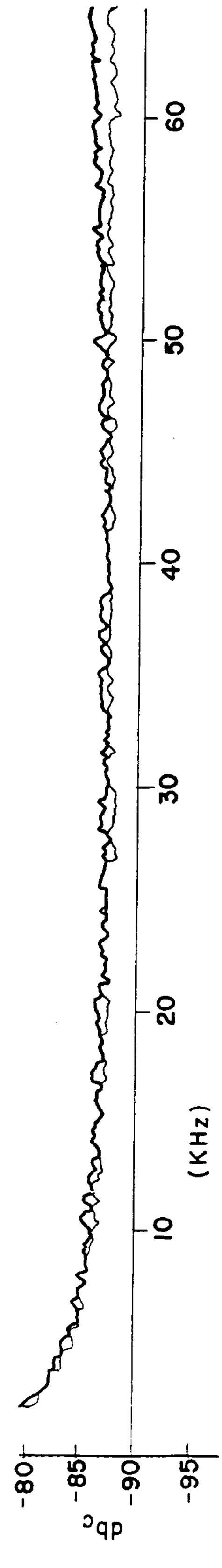
FIGS. 5A–5E are plots of frequency noise-to-signal ratio vs offset frequency of a conventional YIG filter, and YIG filters fabricated in accordance with the present invention.
Figure 5B:
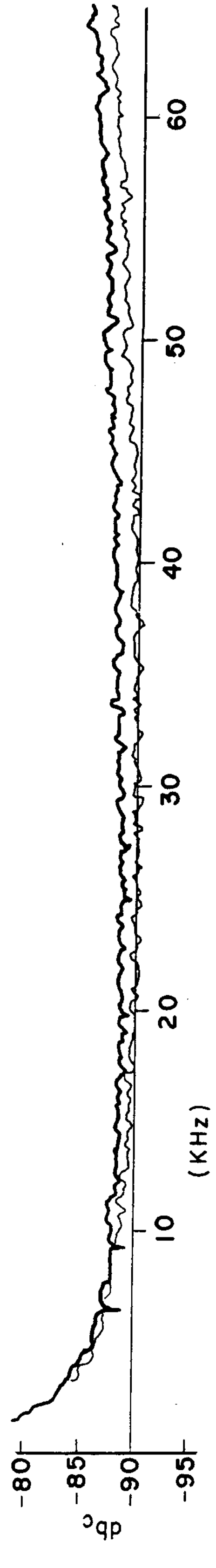
Figure 5C:
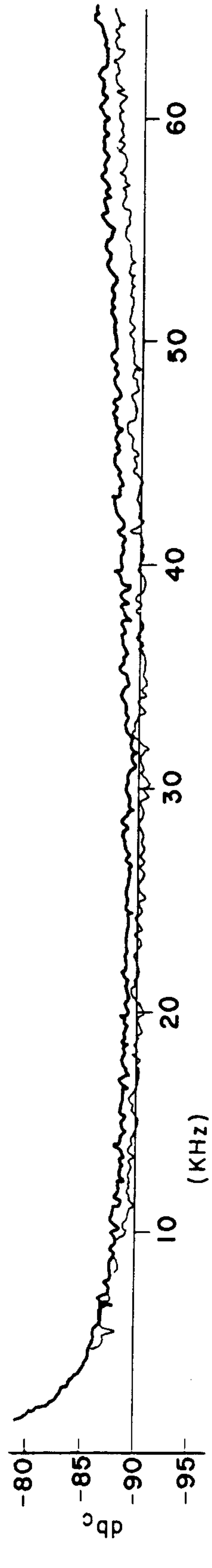
Figure 5D:
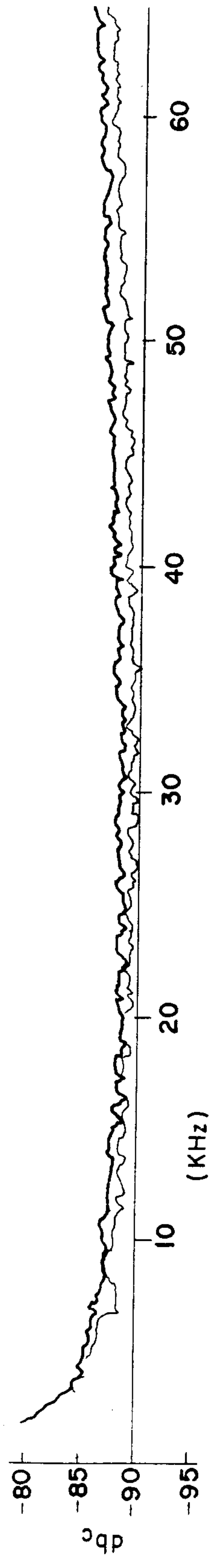
Figure 5E:
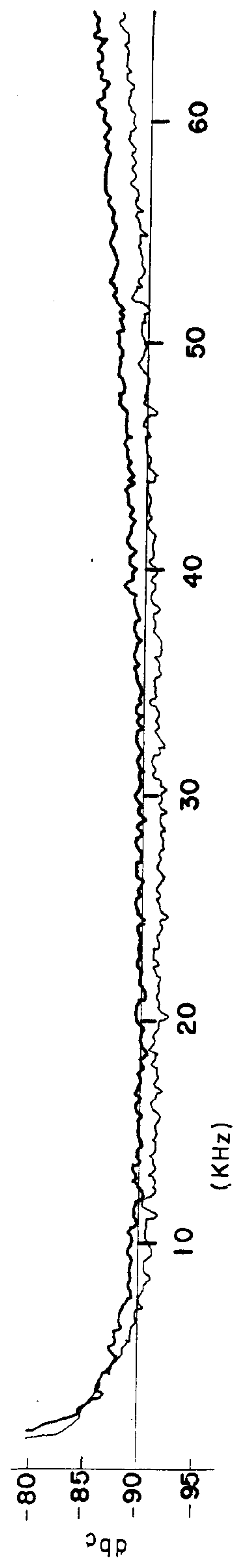

FIG. 5A shows system FM noise-to-signal ratio versus offset frequency for an oscillator having a YIG filter with conventional pole caps fabricated from a magnetically permeable, electrically conductive material. Here an alloy comprising 80%Ni/20%Fe and generally known as permalloy was used to fabricate the pole caps. FIG. 5B shows FM noise-to-signal ratio vs. offset frequency for the oscillator described above employing a YIG filter as described in conjunction with FIGS. 2 and 3 having pole caps fabricated from a lithium zinc manganese ferrite having an approximate composition in mole ratios of 4/30 Li, 3/30 Zn, 1/30 Mn, with the remainder being Fe. FIG. 5C shows system FM noise-to-signal ratio versus offset frequency for the oscillator arrangement as in FIG. 5B except having a pair of pole caps fabricated from AMPEX (Sunnyvale, Calif. 94086) part number 3-5000-B which is also a lithium zinc maganese ferrite. FIG. 5D shows system FM noise-to-signal ratio versus offset frequency for the oscillator arrangement as in FIG. 5B, except having pole caps fabricated from Ampex part number RH70-3 which is a zinc maganese ferrite. FIG. 5E shows system FM noise-to-signal versus offset frequency for the oscillator arrangement as in FIG. 5B, except having a pair of pole caps fabricated from alumina.

With each of the noise frequency plots shown in FIGS. 5B–5E, the ferrite materials (FIGS. 5B–5D) or the magnetically inert, dielectric material (FIG. 5E), is provided with a layer of a conductive material here gold having a thickness of one skin depth at the resonant frequency of the YIG oscillator. A comparison of each of FIGS. 5B–5E with FIG. 5A, therefore, shows that the noise levels are from 2.5 db to 3.0 db lower over the indicated offset frequencies for the YIG filters having pole caps fabricated from electrically insulating, magnetic materials compared to noise level for the conventional permalloy electrically conductive magnetic material arrangement shown in FIG. 5A.

Figure 6:
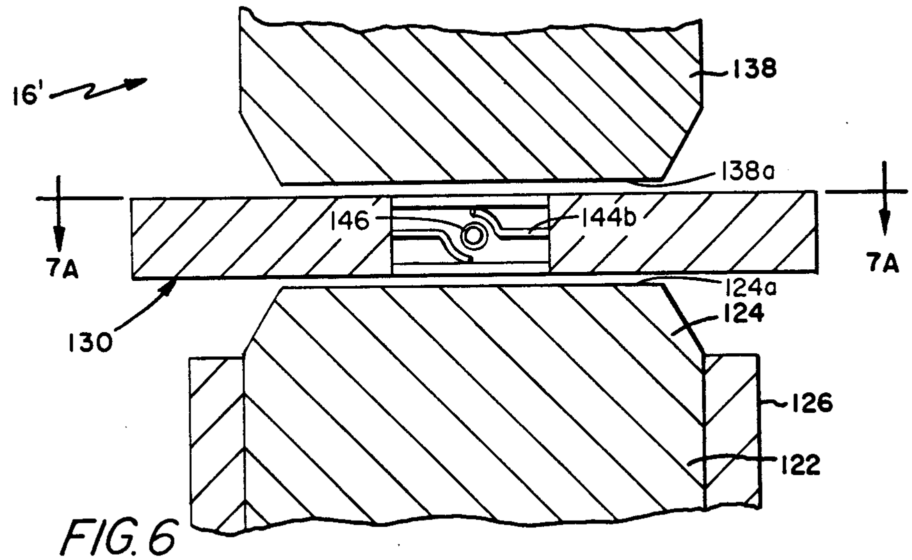
FIG. 6 is an enlarged view of a portion of a YIG filter similar to that shown in FIG. 2, having conventional pole caps, and an r.f. structure fabricated in accordance with a further aspect of the present invention.

Referring now to FIG. 6, a portion of a YIG filter 16' similar in construction to that of FIG. 2 is shown to include a pair of conventional pole pieces 124, 138 fabricated from an electrically conductive, magnetic material, such as permalloy, having disposed between surfaces **124*a*, 138*a* thereof, a modified r.f. structure 130. In particular, r.f. structure 130 may take on any number of configurations, as shown for example in FIGS. 7A through 9**.

Figure 7A:
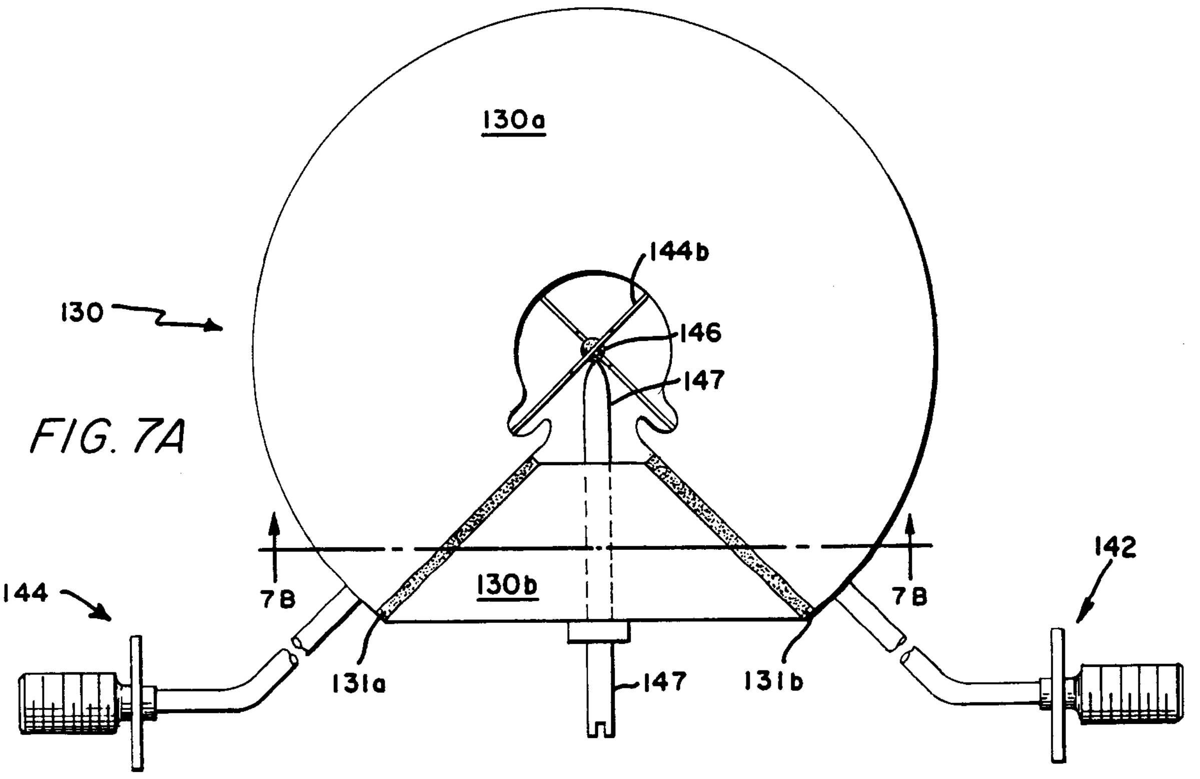
FIG. 7A is a plan view of the r.f. structure of the YIG filter of FIG. 6.
Figure 7B:
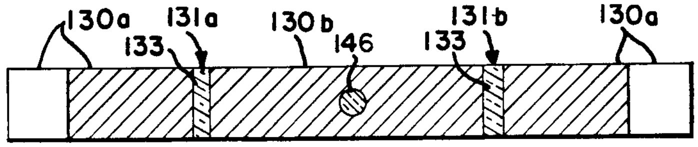
FIG. 7B is a cross-sectional view taken along line 7B—7B of FIG. 7A.

Referring to FIGS. 7A and 7B, modified r.f. structure 130 is shown to include a pair of portions **130*a*, 130*b* bonded together, via a nonconductive agent such as epoxy 133 disposed in slots 131*a*, 131*b*. The slots 131*a*, 131*b* break the electrical continuity around the region through which a YIG sphere 146 is disposed. It is believed that the disruption in electrical continuity prevents eddy current flow around the YIG sphere 146 and eliminates or reduces variations in magnetic fields from this region. Accordingly, there are substantially reduced variations in the magnetic field through the resonant body caused by noise current flow in conductive portions of the r.f. structure 130. Thus, the magnetic field strength through the resonator remains substantially constant as does the frequency and phase characteristics, and the YIG filter 16 with the modified r.f. structure 130 has a substantially lower phase noise and phase variation than conventional YIG filters. When fabricating the YIG filter 16', care must be taken to prevent the pole caps 124, 138 from contacting the r.f. structure 130 and inadvertently provide an electrical path around the slots 131*a*', 131*b*'**.

Figure 8:
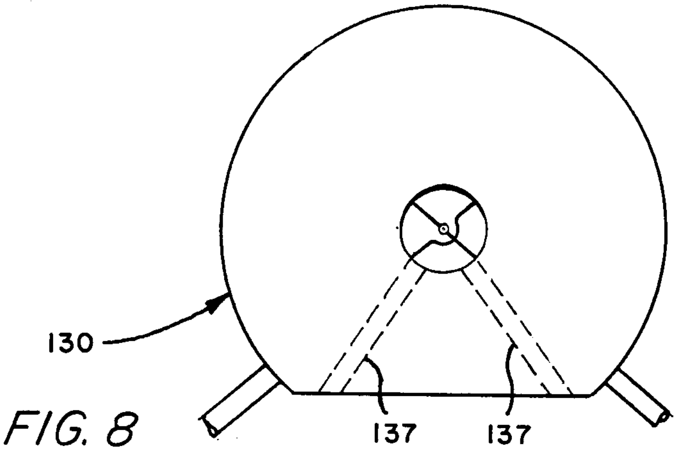
FIGS. 8, 9A, 9B are plan views of alternate arrangements of r.f. structures in accordance with the aspect of the inventions of FIG. 6.

As shown in FIG. 8, a second means for disrupting the electrical continuity or the bulk of conductive material of the r.f. structure is by providing holes 137 here radially through r.f. structure 130. The holes 137 are filled with a dielectric such as air or epoxy or the like; but are provided so that they do not completely sever a portion of the r.f. structure.

Figure 9A:
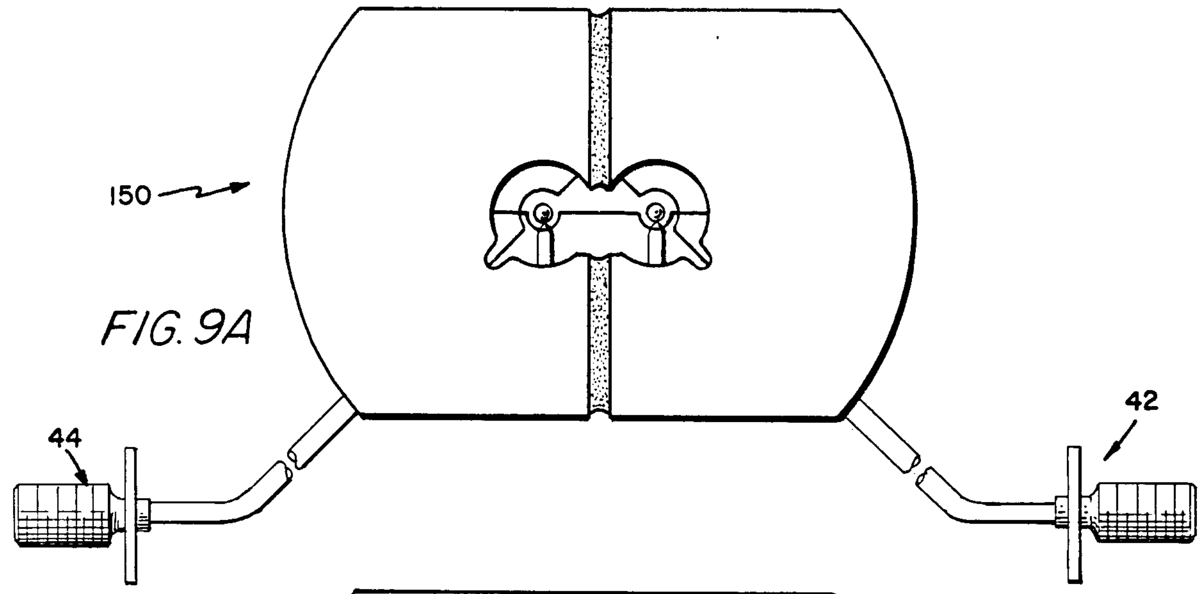
Figure 9B:
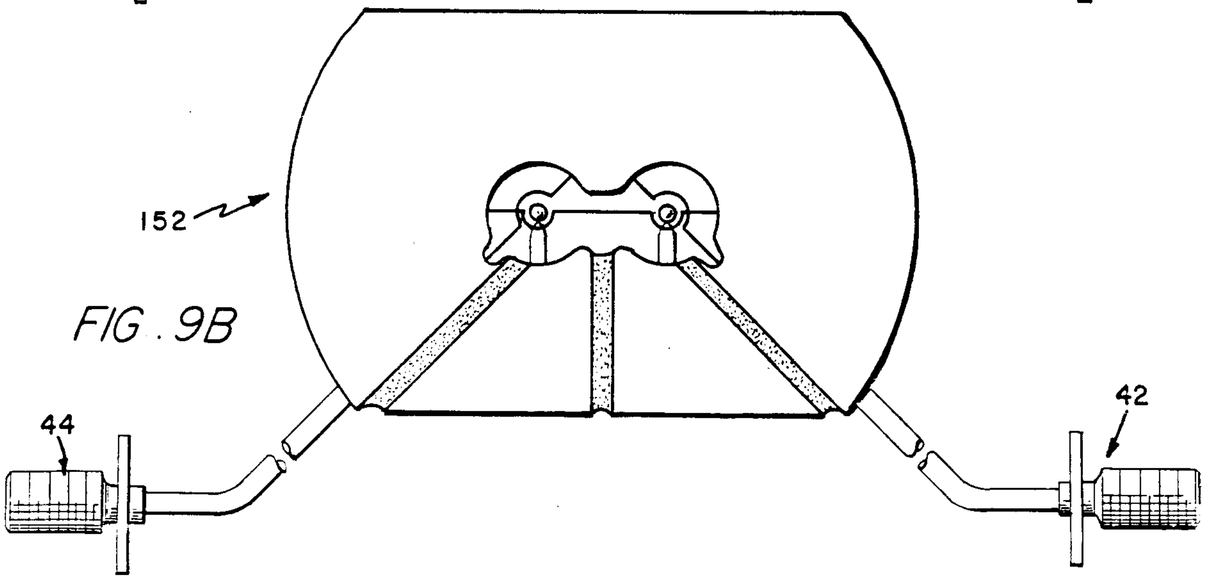

FIGS. 9A, 9B, show various arrangements of r.f. structure 150, 152 for multi-YIG sphere filters having slots (not numbered) to prevent current flow around the resonators.

It is believed that each embodiment of the invention, as described: the ferrite pole caps, 24, 38 having the thin conductive layer; the r.f. structure 130 comprised of a high resistivity material, preferably an electrically insulating material; the r.f. structure having the relatively large aperture within which the YIG sphere is disposed; and the r.f. structure 130' having means provided to interrupt the electrical continuity and prevent current flow around the resonant body; each independently, reduce the phase noise and frequency variations levels of the YIG filter 16, 16', for example, by reducing the bulk of conductive surfaces proximate to the gyromagnetic member 46. It is believed that induced eddy current flow and in particular thermally induced eddy current flow produces small, random variations in magnetic flux density through the gyromagnetic member 46. Each of the above-mentioned embodiments reduces the magnitude of such eddy current flow in conductive regions adjacent the gyromagnetic member 46 and, hence, reduce the magnitude of the magnetic fields generated by these eddy currents.

The ferrite pole caps 24, 28 proximate the resonant body reduce the magnitude of eddy current flow in such pole caps 24, 28, since any eddy current flow is produced only in the thin skin depth conductive coating **24*c*, 28*c*. The relatively large aperture 32 isolates the gyromagnetic member 46 from the sidewalls of the cavity 47 provided in the r.f. structure 30 and isolates the gyromagnetic member 46 from magnetic fields which are produced by these currents. The r.f. structure 30** when fabricated from alumina or other high resistivity material, or having a break in the electrical continuity of the r.f. structure, each reduce the magnitude of eddy current flow in the planar conductive surfaces of the r.f. structure.

Since this thermally generated eddy current flow induces resonant frequency fluctuation, having rates (within doppler frequency shifts as high as 200 KHz) which lie within the doppler frequency shift of the radar, these embodiments therefore are effective in reducing noise levels of the YIG filter 16 (FIGS. 2–4), 16' (FIGS. 6–9) at frequencies which corresponding to the modulation frequencies of expected doppler frequency shifts in a radar receiver. Hence, use of such a low noise YIG filter in an oscillator application such as shown in FIGS. 1 and 10 in such a doppler radar receiver will increase the subclutter visibility of the radar.

Figure 10:
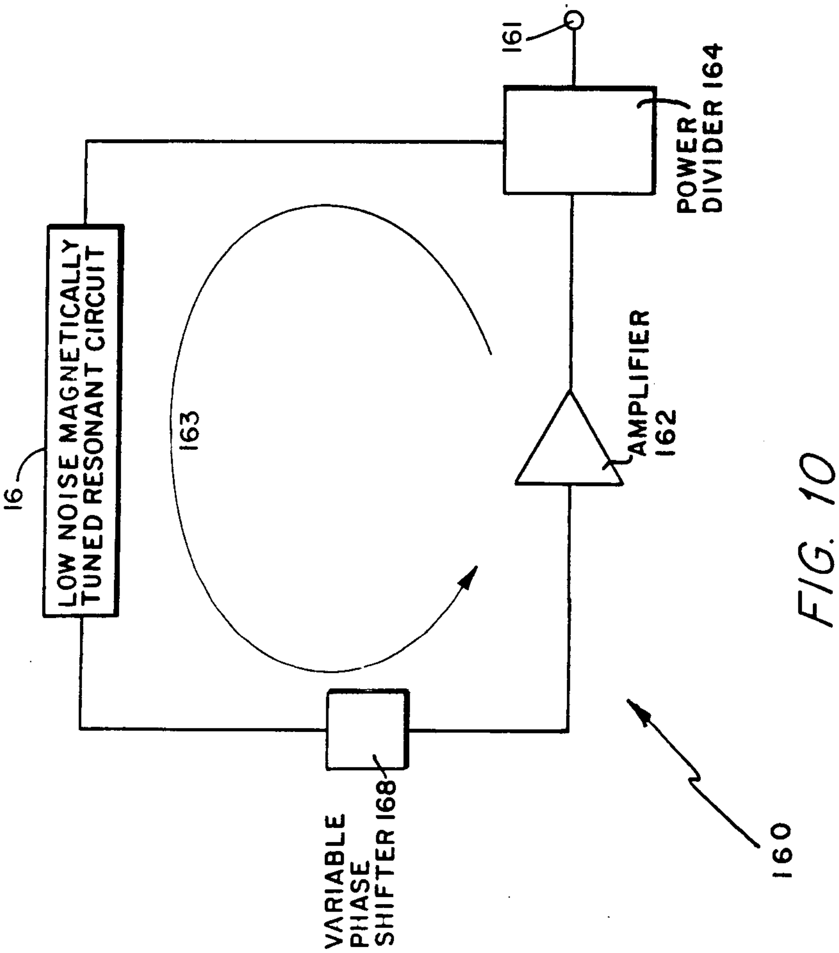
FIG. 10 is a block diagram of an oscillator having a magnetically tuned resonant circuit as a frequency determining element disposed in a feedback circuit of the oscillator.

Referring now to FIG. 10, an oscillator circuit 160 is shown to include an amplifier 162 disposed in a feedback loop indicated by an arrow 163. Disposed between input and output ports of the amplifier 162 is a feedback circuit including a power divider 164, a low noise magnetically tuned resonant circuit 16 or 116 as described above, and a variable phase shifter 168. The low noise magnetically tuned resonant circuit 16 FIGS. 2–4 (or 16' FIGS. 6–9), here a YIG tuned bandpass filter, is used to stabilize the phase and frequency characteristics of the oscillator. The output of amplifier 162 is coupled to the input port of the power divider 164. A first output port of power divider 164 is coupled to the resonant circuit 16 and a second output port of the power divider means 164 is coupled to the output terminal 161 of the oscillator 160 and fed to a load (not shown). By using low noise components in the oscillator circuit 160, the output signal fed to terminal 161 will have a frequency spectrum having substantial energy at $f_c$, the center band frequency of the oscillator, with substantially reduced energy at frequencies of at least ±200 KHz from $f_c$. The frequency of the output signal fed to amplifier 167 is provided in accordance with the phase and frequency characteristics of the signal fed back to the input of amplifier 162. The phase and frequency characteristics of the signal are in turn controlled by the phase and frequency characteristics of the YIG tuned filter 16, the phase shifter 168 and the other components in the feedback loop of the oscillator, as is known in the art. Accordingly, by providing the low noise magnetically tuned resonant circuit 16, or (116) in the oscillator, a low noise oscillator 160 is provided.

Having described preferred embodiments of the invention, it will now be apparent to one of ordinary skill in the art that other embodiments incorporating its concept may be used. For example, the embodiments described in conjunction with FIGS. 2–4 may be combined together, as well as the embodiments shown in FIGS. 6–9. It is felt, therefore, that this invention should not be limited to the disclosed embodiments, but rather should be limited only by the spirit and scope of the appended claims.

What is claimed is:

1. A magnetically tuned resonant circuit, comprising:

(a) means for producing magnetic flux;

(b) means for providing a magnetic flux path, having a pair of opposing spaced surfaces;

(c) a magnetically inert member having an aperture in said inert member, said member being disposed between said pair of opposing spaced surfaces;

(d) a gyromagnetic member disposed through the aperture in said inert member, with said inert member disposed to have said magnetic flux directed through said gyromagnetic member; and (e) means, disposed proximate to said pair of opposing, spaced surfaces, for reducing those variations in the magnetic flux directed through said gyromagnetic member that are not caused by mechanical loading of the flux path means.

2. The circuit of claim 1 wherein said means for reducing magnetic flux variations reduces thermally induced eddy current flow in conductive regions proximate to the gyromagnetic body and concomitantly therewith reduces the magnitude of magnetic fields induced by said eddy current flow.

3. The circuit of claim 1 wherein said means for reducing magnetic flux variations includes a pair of members disposed adjacent said magnetically inert member, said pair of members providing the pair of opposing spaced surfaces, and with at least one of said pair of members being comprised of a magnetically permeable, electrically insulating material.

4. The circuit of claim 3 wherein said member comprised of the magnetically permeable, electrically insulating material has disposed over surfaces thereof, a coating of an electrically conductive material.

5. The circuit of claim 4 wherein said magnetically permeable, electrically insulating material is a ferrite and wherein said coating has a thickness in the range of about one to ten skin depths at the resonant frequency of said resonant circuit.

6. The circuit of claim 1 wherein said means for reducing magnetic flux variations includes the magnetically inert member, with said inert member being comprised of a magnetically inert, electrically insulating material.

7. The circuit of claim 6 wherein said magnetically inert body member has disposed over surfaces thereof, a thin coating of an electrically conductive material.

8. The circuit of claim 7 wherein said magnetically inert electrically insulating material is selected from the group consisting of $Al_2O_3$, BeO, $SiO_2$, and said coating has a thickness in the range of about one to ten skin depths at the resonant frequency of said resonant circuit.

9. The circuit of claim 1 wherein said means for reducing magnetic flux variations is the magnetically inert member, said magnetically inert member further comprising:

means for interrupting the electrical continuity in a region of the magnetically inert member disposed around the gyromagnetic body.

10. The circuit of claim 9 wherein said means for interrupting electrical continuity includes at least one passageway in said magnetically inert member, with said passageway being filled with an electrically insulating material.

11. The circuit of claim 10 wherein said passageway severs a portion of said magnetically inert member and is filled with an insulating material.

12. The circuit of claim 10 wherein said passageway is provided through a radial portion of said member and does not sever a portion of said member.

13. The circuit of claim 1 wherein said gyromagnetic body is a sphere having a selected diameter and said means for reducing magnetic flux variations is said magnetically inert member, having said aperture provided with a diameter at least equal to five times the diameter of said gyromagnetic sphere.

14. The circuit of claim 1 wherein said means for reducing magnetic flux variations in said magnetically inert member comprises a high resistivity material having a resistivity of greater than about 100 micro ohms-cm.

15. The circuit of claim 14 wherein said high resistivity material is a metal alloy and is selected from the group consisting of 67Cu-5Ni-27Mn alloy, 80 Ni-20Cr alloy, 75Ni-20Cr-3Au+remainder Fe or Cu alloy, and 72Fe-23Cr-5Al-0.5Co alloy.

16. A magnetically tuned filter circuit comprising:

means for producing magnetic flux;

a housing comprising of a magnetically permeable material having a pair of opposing spaced surfaces;

a r.f. structure having an aperture therein, said r.f. structure being disposed between said pair of opposing spaced surfaces;

a gyromagnetic member disposed in said aperture in said r.f. structure and disposed to have said magnetic flux directed through said gyromagnetic member;

means for providing an input radio frequency signal to, and an output radio frequency signal from said gyromagnetic member with said output signal having a frequency related to the magnetic flux directed through the gyromagnetic member;

wherein said r.f. structure is disposed under a predetermined compression with said housing to reduce vibration induced changes in the frequency of said output signal; and means, disposed proximate to said pair of opposing spaced surfaces, for reducing the bulk of conductive portions of said filter in close proximity to the gyromagnetic body to reduce phase noise in the output signal.

17. The circuit of claim 16 wherein said means for reducing the bulk of conductive portions includes a pair of members disposed adjacent said r.f. structure, with said pair of members providing the pair of opposing spaced surfaces of said housing, and with at least one of said pair of members being comprised of a magnetically permeable, electrically insulating material.

18. The circuit of claim 17 wherein said member comprised of the magnetically permeable, electrically insulating material has disposed over surfaces thereof, a coating of an electrically conductive material.

19. The circuit of claim 18 wherein said magnetically permeable, electrically insulating material is a ferrite and wherein said coating has a thickness in the range of about one to ten skin depths at the resonant frequency of said resonant circuit.

20. The circuit of claim 16 wherein said means for reducing frequency noise in the output signal includes the r.f. structure being comprised of a magnetically inert, electrically insulating, material.

21. The circuit of claim 20 wherein said magnetically inert r.f. structure has disposed over surfaces thereof, a thin coating of an electrically conductive material.

22. The circuit of claim 21 wherein said magnetically inert electrically insulating material is selected from the group consisting of $Al_2O_3$, BeO, $SiO_2$, and said coating has a thickness in the range of about one to ten skin depths at the resonant frequency of said resonant circuit.

23. The circuit of claim 16 wherein said means for reducing the bulk of conductive portions is the r.f. structure, said r.f. structure includes means for interrupting the electrical continuity in a region of the r.f. structure disposed around the gyromagnetic body.

24. The circuit of claim 23 wherein said means for interrupting electrical continuity includes at least one passageway in said magnetically inert member, with said passageway being filled with an electrically insulating material.

25. The circuit of claim 24 wherein said passageway severs a portion of said member and is filled with an insulating material.

26. The circuit of claim 25 wherein said passageway is provided through a radial portion of said member and does not sever a portion of said member.

27. The circuit of claim 16 wherein said gyromagnetic body is a sphere having a selected diameter and said means for reducing the bulk of conductive portions is said aperture in said r.f. structure having a diameter equal to at least five times the diameter of said gyromagnetic sphere.

28. The circuit of claim 16 wherein said means for reducing the bulk of conductive portions is said r.f. structure comprised of a high resistivity material having a resistivity of greater than 100 micro ohms-cm.

29. The circuit of claim 24 wherein said high resistivity material is an alloy and is selected from the group consisting of 67Cu-5Ni-27Mn alloy, 80Ni-20Cr alloy, 75Ni-20Cr-3Au+remainder Fe or Cu alloy, and 72Fe-23Cr-5Al-0.5Co alloy.

30. A low noise oscillator comprising;

means, having an input and an output, for providing at the output thereof, an electrical signal having a predetermined amplitude;

means for feeding a portion of said signal back to said input of the amplitude means, further comprising:

means for providing a predetermined phase shift characteristic to said signal portion fed back to the input of said amplitude means, comprising:

means for producing magnetic flux;

means for providing a closed magnetic flux path, comprising:

(i) a housing comprised of a magnetically permeable material having a pair of opposing, spaced surfaces;

(ii) a magnetically inert member having an aperture, said inert member being disposed between said pair of opposing spaced surfaces;

(iii) a gyromagnetic member disposed through the aperture in said inert member, with said inert member disposed to have said magnetic flux directed through said gyromagnetic member;

(iv) means, disposed proximate to said pair of opposing, spaced surfaces, for reducing variations in phase shift imparted to said signal, with said phase shift variations not resulting from mechanical loading of said housing.

31. The oscillator of claim 30 wherein said means for reducing magnetic field variations reduces thermally induced eddy current flow in regions proximate to the gyromagnetic body and concomitantly reduces magnetic fields induced by said eddy current flow.

32. The oscillator of claim 30 wherein said means for reducing magnetic field variations includes a pair of member disposed adjacent said magnetically inert member said pair of members providing the pair of opposing surfaces of said housing, with at least one of said pair of members being comprised of a magnetically permeable, electrically insulating material.

33. The oscillator of claim 32 wherein said magnetically permeable, electrically insulating member has disposed over surfaces thereof, a thin coating of an electrically conductive material.

34. The oscillator of claim 33 wherein said magnetically permeable, electrically insulating material is a ferrite and wherein said coating has a thickness of about one to ten skin depths at the resonant frequency of said resonant circuit.

35. The oscillator of claim 30 wherein said means for reducing magnetic field variations is the magnetically inert member, said member being comprised of a magnetically inert, electrically insulating material.

36. The oscillator of claim 35 wherein said member has disposed over surfaces thereof, a thin coating of an electrically conductive material.

37. The oscillator of claim 36 wherein said magnetically inert electrically insulating material is selected from the group consisting of $Al_2O_3$, BeO, and $SiO_2$ and said coating has a thickness of about one to ten skin depths at the resonant frequency of said resonant circuit.

38. The oscillator of claim 30 wherein said means for reducing magnetic field variations is the magnetically inert member, said body member further comprising:

means for interrupting electrical continuity in the magnetically inert member to prevent eddy current flow around the aperture wherein is disposed the gyromagnetic body.

39. The oscillator of claim 38 wherein said means for interrupting electrical continuity includes a passageway through said magnetically inert member, with said passageway being filled with an electrically insulating material.

40. The oscillator of claim 30 wherein said gyromagnetic body is a sphere having a selected diameter and said means for reducing magnetic field variations is said magnetically inert member having said aperture provided with a diameter equal at least five times the diameter of said gyromagnetic sphere.

41. The oscillator of claim 30 wherein said means for reducing magnetic field variations is said magnetically inert member comprising a high resistivity material having a resistivity of greater than 100 micro ohms-cm.

42. The oscillator of claim 40 wherein said high resistivity material is a metal alloy and is selected from the group consisting of 67Cu-5Ni-27Mn alloy, 80Ni-20Cr alloy, 75Ni-20Cr-3Au+remainder Fe or Cu alloy, and 72Fe-23Cr-5Al-0.5Co alloy.

43. A low noise oscillator comprising:

means for producing voltage controlled oscillations having a predetermined frequency modulation noise characteristic;

a feedback circuit disposed around said voltage controlled oscillation means including:

a frequency discriminator circuit, said frequency discriminator circuit comprising:

a low noise magnetically tuned filter comprising:

means for producing magnetic flux;

a housing comprised of a magnetically permeable material having a pair of opposing spaced surfaces;

a magnetically inert member having an aperture in said inert member, being disposed between said pair of opposing spaced surfaces;

a gyromagnetic member disposed in said aperture and disposed to have said magnetic flux directed through said gyromagnetic member;

means for providing an input radio frequency signal to and an output radio frequency signal from said gyromagnetic member with said output signal having a frequency related to the magnetic flux directed through the gyromagnetic member; and means, disposed proximate to said pair of opposing spaced surfaces, for reducing frequency modulation noise not caused by mechanical loading of the housing in the output signal.

44. The circuit of claim 43 wherein said means for reducing frequency modulation noise includes a pair of members disposed adjacent said inert member having a pair of opposing surfaces, which provide the pair of opposing surfaces of said housing, at least one of said pair of members being comprised of a magnetically permeable, electrically insulating material.

45. The circuit of claim 44 wherein said member comprised of the magnetically permeable, electrically insulating material has disposed over surfaces thereof, a coating of an electrically conductive material.

46. The circuit of claim 45 wherein said magnetically permeable electrically insulating material is a ferrite and wherein said coating has a thickness of about one to ten skin depths at the resonant frequency of said resonant circuit.

47. The circuit of claim 43 wherein said means for reducing frequency modulation noise is the magnetically inert body member, said member being comprised of a magnetically inert, electrically insulating, material.

48. The circuit of claim 47 wherein said magnetically inert body member has disposed over surfaces thereof, a thin coating of an electrically conductive material.

49. The circuit of claim 48 wherein said magnetically inert electrically insulating material is selected from the group consisting of $Al_2O_3$, BeO, $SiO_2$, and said coating has a thickness of about one to ten skin depths at the resonant frequency of said resonant circuit.

50. The circuit of claim 43 wherein said means for reducing frequency modulation noise is the magnetically inert body member, said body member further comprising:

means for interrupting the electrical continuity in the body member around the aperture wherein is disposed the gyromagnetic body.

51. The circuit of claim 50 wherein said means for interrupting electrical continuity includes at least one passageway through said magnetically inert member, with said passageway being filled with an electrically insulating material.

52. The circuit of claim 43 wherein said gyromagnetic body is a sphere having a selected diameter and said means for reducing frequency modulation noise is said magnetically inert body member, having said aperture with a diameter equal to at least five times the diameter of said gyromagnetic sphere.

53. The circuit of claim 43 wherein said means for reducing magnetic field variations is said magnetically inert member comprised of a high resistivity material having a resistivity of greater than 100 micro ohms-cm.

54. The circuit of claim 53 wherein said high resistivity material is a metal alloy and is selected from the group consisting of 67Cu-5Ni-27Mn alloy, 80Ni-20Cr alloy, 75Ni-20Cr-3Au+remainder Fe or Cu alloy, and 72Fe-23Cr-5Al-0.5Co alloy.

* * * * *